(12) United States Patent
Miyazaki et al.

(10) Patent No.: US 6,622,292 B2
(45) Date of Patent: Sep. 16, 2003

(54) DESIGN METHOD FOR LOGIC CIRCUIT, DESIGN SUPPORT SYSTEM FOR LOGIC CIRCUIT AND READABLE MEDIA

(75) Inventors: Ko Miyazaki, Kokubunji (JP); Kazuhiko Eguchi, Nagoya (JP); Tadaaki Tanimoto, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/921,794

(22) Filed: Aug. 6, 2001

(65) Prior Publication Data

US 2002/0032894 A1 Mar. 14, 2002

(30) Foreign Application Priority Data

Sep. 14, 2000 (JP) .......................... 2000-279734

(51) Int. Cl.[7] ............................. G06F 17/50
(52) U.S. Cl. ................... 716/9; 716/1; 716/8; 716/10; 716/11
(58) Field of Search ....................... 716/1–21

(56) References Cited

U.S. PATENT DOCUMENTS

| | | | | |
|---|---|---|---|---|
| 5,040,134 A | * | 8/1991 | Park ........................... | 706/34 |
| 5,673,198 A | * | 9/1997 | Lawman et al. .............. | 716/11 |
| 5,768,479 A | * | 6/1998 | Gadelkarim et al. ......... | 706/52 |
| 6,014,506 A | * | 1/2000 | Hossain et al. ............... | 716/11 |
| 6,086,625 A | * | 7/2000 | Shouen ......................... | 716/1 |
| 6,090,151 A | * | 7/2000 | Gehman et al. .............. | 716/5 |
| 6,260,178 B1 | * | 7/2001 | Schaffer ....................... | 716/2 |
| 6,405,349 B1 | * | 6/2002 | Gehman et al. .............. | 716/4 |

FOREIGN PATENT DOCUMENTS

| | | |
|---|---|---|
| JP | 3-265974 | 11/1991 |
| JP | 4-070906 | 3/1992 |

OTHER PUBLICATIONS

K. Eguch et al,"Fuzzy Inference for the Initial Population of Genetic Algorithms Applied to VLSI Floorplanning Design" Mar. 1999,Industrial Electronics Society, IECON'99 Proceedings, pp. 502–508.*
K. Egushi et al,"Application of Fuzzy Inference and Genetic Algorithms to VLSI Floorplanning Design" Feb. 2000, Industrial Electronics Society, IECON '00 Proceedings, pp. 184–188.*
A. Shaout et al, "Fuzzy Test System" Proc. 43rd IEEE Midwest Symp. on Circuits and Systems, Lansing MI, Aug. 8–11, 2000, pp1372–1375.*
A. Shaout et al, "Distance Measure for Attributed Fuzzy Tournaments" IEE proceedings, vol. 139, No. 5, Sep. 1992, pp 373–378.*

* cited by examiner

Primary Examiner—Vuthe Siek
Assistant Examiner—Magid Y Dimyan
(74) Attorney, Agent, or Firm—Miles & Stockbridge P.C.

(57) ABSTRACT

The optimization algorithm candidate of a plurality of circuit blocks given with the logic circuit description based on the hardware description language is determined considering the Hamming distance of circuit block (S1 to S3). The common circuit blocks of the optimization algorithm candidate determined in the first process are then grouped considering the coupling degree among circuit blocks (S4 to S6). Result of grouping is the result for the circuit blocks having apparent characteristic in the algorithm candidate and coupling degree and the circuit blocks having uncertain characteristics are also left. In view of optimizing the grouping for the circuit blocks having uncertain characteristics, the grouping of a plurality of circuit blocks is optimized with the hereditary algorithm by reflecting the result of grouping on the initial condition. Thereby, the logical composition for the logic circuit description based on the hardware description language can be optimized and the necessary time can be shortened.

24 Claims, 8 Drawing Sheets

FIG. 2
```
assign Z=A+B+Cin
always @ (SI, IN)
  begin
    case (SI)
      2'b00 : OUT=IN [0] ;
      2'b01 : OUT=IN [1] ;
      2'b10 : OUT=IN [2] ;
      2'b11 : OUT=IN [3] ;
    endcase
  end
```
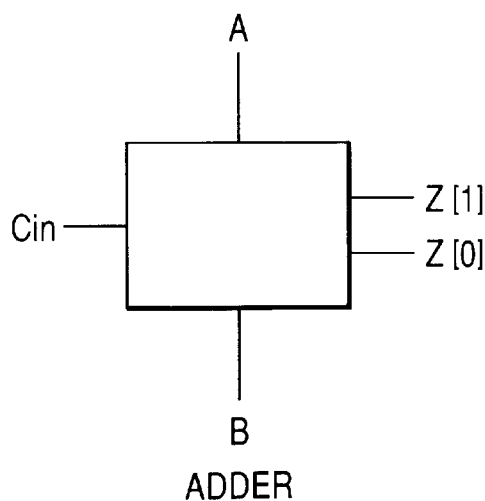
FIG. 3(A)
ADDER
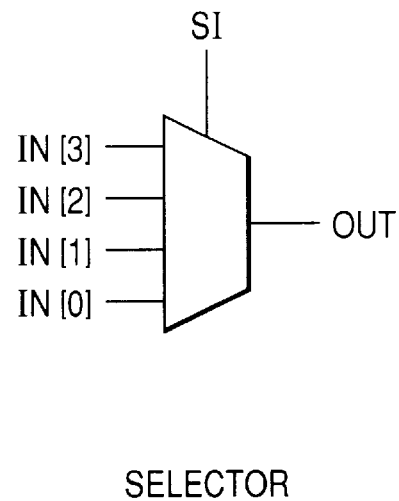
FIG. 3(B)
SELECTOR

FIG. 4(A)

| Cin | A | B | Z[1] | Z[0] |
|---|---|---|---|---|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

TRUTH VALUE TABLE OF ADDER

FIG. 4(B)

|  | Cin | A | B |
|---|---|---|---|
| Z[1] | 2 | 2 | 2 |
| Z[0] | 4 | 4 | 4 |

$((4-2)*3+(4-4)*3)/(2*3*4)=0.25$
→AND-EOR OPTIMIZATION

FIG. 4(C)

{ EXAMPLE OF HAMMING DISTANCE OF ADDER AND OPTIMIZED ALGORITHM CANDIDATE DETERMINATION }

(— : DON'T CARE)

| SI [1] | SI [0] | IN [3] | IN [2] | IN [1] | IN [0] | OUT |
|---|---|---|---|---|---|---|
| 0 | 0 | — | — | — | 0 | 0 |
| 0 | 0 | — | — | — | 1 | 1 |
| 0 | 1 | — | — | 0 | — | 0 |
| 0 | 1 | — | — | 1 | — | 1 |
| 1 | 0 | — | 0 | — | — | 0 |
| 1 | 0 | — | 1 | — | — | 1 |
| 1 | 1 | 0 | — | — | — | 0 |
| 1 | 1 | 1 | — | — | — | 1 |

TRUTH VALUE TABLE OF SELECTOR

|     | SI [1] | SI [0] | IN [3] | IN [2] | IN [1] | IN [0] |
|---|---|---|---|---|---|---|
| OUT | 4 | 4 | 0 | 0 | 0 | 0 |

((4−4)*2+(4−0)*4)/(6*1*4)=0.67
→AND−OR OPTIMIZATION

[ EXAMPLE OF HAMMING DISTANCE AND OPTIMIZED ALGORITHM CANDIDATE DETERMINATION ]

FIG. 7(A)
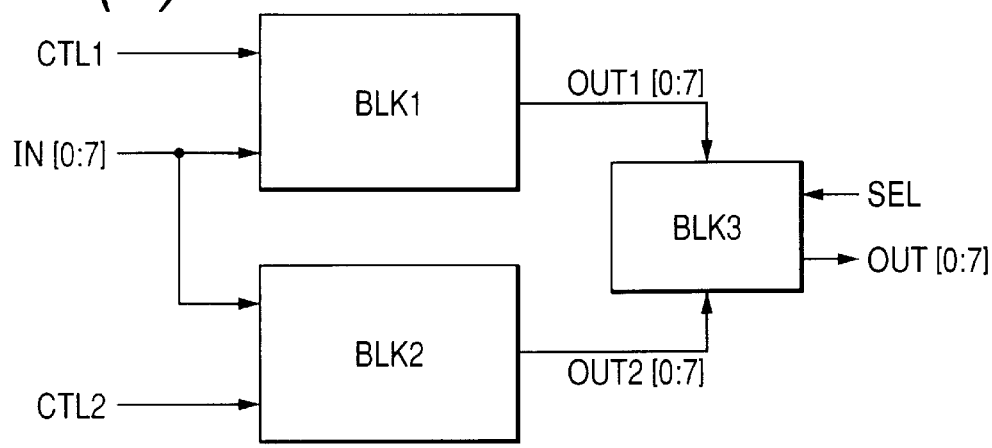
FIG. 7(B)
| COMBINATION OF BLOCKS | COUPLING DEGREE |
|---|---|
| BLK1+BLK2 | 8/26=0.31 |
| BLK1+BLK3 | 8/34=0.24 |
| BLK2+BLK3 | 8/34=0.24 |
| BLK1+BLK2+BLK3 | 24/35=0.69 |
FIG. 8
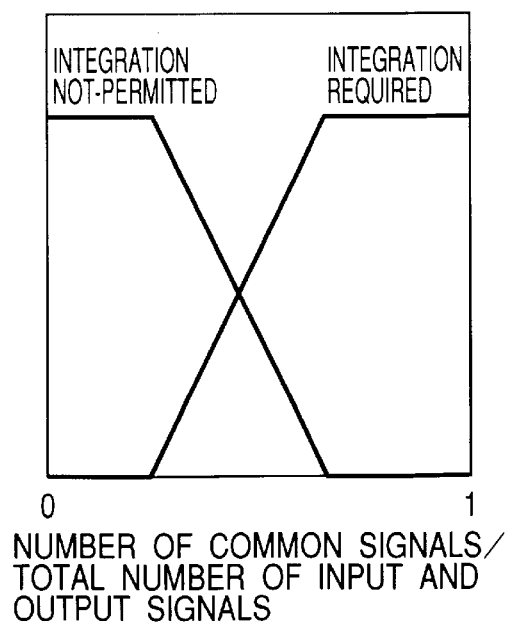

FIG. 12

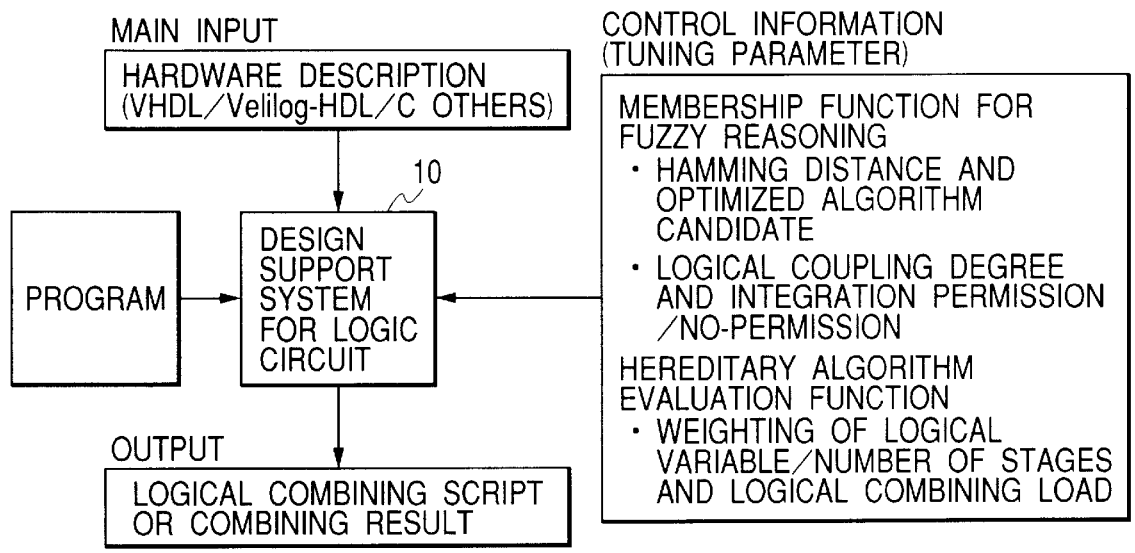

MAIN INPUT
HARDWARE DESCRIPTION
(VHDL/Velilog-HDL/C OTHERS)

PROGRAM → DESIGN SUPPORT SYSTEM FOR LOGIC CIRCUIT (10)

OUTPUT
LOGICAL COMBINING SCRIPT OR COMBINING RESULT

CONTROL INFORMATION (TUNING PARAMETER)
MEMBERSHIP FUNCTION FOR FUZZY REASONING
· HAMMING DISTANCE AND OPTIMIZED ALGORITHM CANDIDATE
· LOGICAL COUPLING DEGREE AND INTEGRATION PERMISSION /NO-PERMISSION
HEREDITARY ALGORITHM EVALUATION FUNCTION
· WEIGHTING OF LOGICAL VARIABLE/NUMBER OF STAGES AND LOGICAL COMBINING LOAD

FIG. 13

```
module M_AdrsPTR_0_inc_5_0 (A, SUM) ;
   input [4:0] A ;
   output [4:0] SUM ;
   wire net91535 ;
   wire net91534 ;
   wire net91525 ;
   xo02d0 U6 (.a1(A [4]) , .a2(net91535) , .z(SUM [4])) ;
   in01d0 U7 (.i(A [0]) , .zn(SUM [0])) ;
   ah01d0 U10 (.a(A [3]) , .b(net91525) , .co(net91535) , .s(SUM [3])) ;
   ah01d0 U8 (.a(A [1]) , .b(A [0]) , .co(net91534) , .s(SUM [1])) ;
   ah01d0 U9 (.a(A [2]) , .b(net91534) , .co(net91525) , .s(SUM [2])) ;
endmodule
```

DESIGN METHOD FOR LOGIC CIRCUIT, DESIGN SUPPORT SYSTEM FOR LOGIC CIRCUIT AND READABLE MEDIA

BACKGROUND OF THE INVENTION

The present invention relates to a design method for logic circuit, a design support system for a logic circuit and a readable media and particularly to a technique which can be adapted effectively for optimization of a logical composition based on a logic circuit description utilizing a hardware description language.

In a logical design of semiconductor integrated circuits, the hardware description language such as VHDL (Verilog Hardware Description Language) similar to the programming language such as a C-language is used with improvement in a logical scale and an integration density. A logic circuit, for example, in the gate level can be obtained by conducting a logical composition process for the logic circuit description described with the hardware description language. In this case, since it is impossible, from the viewpoint of the scale or computer capability, to simultaneously realize logical composition of the chip as a whole of semiconductor integrated circuit, it is essential to divide the logical composition process in the unit as small as possible within the range of the overhead for the division as narrow as possible. It is enough that this division is made in the range assuring higher independence of logic to provide the scale to realize logical composition but smaller division is further required in actual because the logical scale must be lowered to optimize the logical composition. Moreover, on the occasion of logically composing the units of division, it is required to select and adapt the optimum algorithm from several algorithm candidates. In the actual logical composition, logical division and selection of the optimum algorithm are entangled to increase difficulty for solution and trial and error have been manually repeated to solve such problems.

The technique for introducing the determination process which is an experimental performance of the people into the process control or the like is described in the Official Gazette, Japanese Laid-Open Patent Applications No. HEI 3(1991)-265974 for employment of the fuzzy reasoning into the system design support and No. HEI 4(1992)-70906 for employment of the fuzzy reasoning into the determination of optimization of the control system.

SUMMARY OF THE INVENTION

However, the inventors of the present invention have found there rises a problem that fluctuation in the composition result becomes large in addition to increase in the man-hours and period for manufacture, if manual trial and error process occupies the greater part for solution of the complicated phenomenon such as logical division and selection of algorithm candidates at the time of logical composition.

The inventors of the present invention have discussed adaptation, into the logical composition, of automatic means which is similar to optimization based on the discovery which is experimental event of people but the related art using the fuzzy reasoning does not give any hint thereto.

It is therefore an object of the present invention to provide a design method for logic circuit, a design support system for the logic circuit and a readable medium having recorded the design support program for the logic circuit which can reduce the period required for logical composition for the logic circuit description based on the hardware description language.

It is another object of the present invention to provide a design method for the logic circuit, a design support system for the logic circuit and a readable medium having recorded the design support program for the logic circuit which can reduce usual fluctuation of the logical composition result for the logic circuit description based on the hardware description language.

It is further object of the present invention to provide a design method for logic circuit, a design support system for the logic circuit and a readable medium having recorded the design support program for the logic circuit which can make contribution to improvement of performance of the semiconductor integrated circuit designed via the logical composition for the logic circuit description based on the hardware description language.

The aforementioned and the other objects and other features of the present invention will becomes more apparent from the description of the present specification and the accompanying drawings.

The typical invention among those disclosed in the present application will be summarized briefly in the following explanation.

[1] In the present invention, the automatic method similar to the optimization based on the discovery which is an experimental phenomenon of people is adapted to the logical composition for the logic circuit description based on the hardware description language. Namely, the optimization algorithm candidates of a plurality of circuit blocks which are given with the logic circuit description based on the hardware description language are determined (first process) using the fuzzy reasoning in which the Hamming distance of circuit block is taken into consideration. The common circuit block of the optimization algorithm candidates determined in the first process is grouped using the fuzzy reasoning in which a coupling degree among circuit blocks are taken into consideration (second process). Result of grouping based on the fuzzy reasoning is also a result for the circuit block obviously characterized in the algorithm candidates and coupling degree and the circuit block having a rather uncertain characteristics are not grouped or tentatively grouped with the other method. In order to promote optimization of grouping for the circuit block having rather uncertain characteristic, the third process is executed to optimize the grouping of a plurality of circuit blocks based on the hereditary algorithm by reflecting the result of grouping with the second process on the initial condition.

The present invention will be explained in detail by referring to the other profile of the invention. The initial values to be integrated based on the fuzzy reasoning are determined for a plurality of circuit blocks (for example, circuit block specified with the always block or function block or the like) given with the logic circuit description based on the hardware description language. The membership function used for fuzzy reasoning is first a function to specify the correlation between the index considering the Hamming distance obtained from the truth value table of each circuit block and the optimization algorithm candidates. For example, the logic in which the Hamming distance is matched with the number of signals of circuit block is the function of inverter, while the logic in which the Hamming distance is similar to a half (½) of the number of signals is similar to the function of EOR (exclusive logical sum) and other logics are characterized similar to the function of AND-OR. As the index explained above, it is possible to employ the average Hamming distance index which is given as $\Sigma|Hij-S/2|/(N*M*S/2)$ wherein number of conditions of circuit block is S, number of input signals of circuit block is N, number of output signals of circuit block is M and the Hamming distance between the i-th input signal and j-th output signal is Hij. The membership function is secondly a function to specify the correlation between a coupling degree obtained from matching ability of the input/output signals among mutual circuit blocks and permission/no-permission of integration for the circuit block. Depending on such membership function, the optimization algorithm candidates are assigned to the circuit blocks and the circuit blocks having higher coupling degrees among those having the same algorithm as the candidate is grouped as the circuit blocks to be integrated with the logical composition.

A result of grouping for the circuit blocks to be integrated is reflected on the initial condition of the individuals to optimize the grouping of a plurality of circuit blocks with the hereditary algorithm. Each individual uses a pair, for example, of integrated circuit block and algorithm candidate as the data and V*S*L as the evaluation function (the symbol * means multiplication) when the number of variables of logical equation expressed with the integrated circuit block is defined as V, number of stages of logic as S and a combined load which increases depending on the scale of logic as L. A plurality of individuals which are well evaluated based on the evaluation function are selected, generation is stacked to set up the heredity to the common part of genes of a plurality of selected individuals and thereby the individual of which evaluation has reached the specified value can be obtained as the optimized solution.

The result derived through the optimization process with the hereditary algorithm suggests the division within the scale of logics to be combined to result in the overhead as small as possible and the optimization algorithm for such block is simultaneously determined. Therefore, the logical composition result can be obtained immediately by following such result. Moreover, it is also possible to reduce the period required for logical composition for logic circuit description based on the hardware description language and to reduce usual fluctuation of the logical composition result for the logic circuit description based on the hardware description language. Therefore, much contribution can be made for improvement of performance of the semiconductor integrated circuit which is designed via the logical composition for the logic circuit description based on the hardware description language.

[2] A design method for logic circuit can be realized with a design support system for logic circuit comprising an input means, a memory means and a data processing means for executing the arithmetic processes utilizing an input information from the input means and also using the memory means. In the design support system for logic circuit, the input means is capable of inputting the logic circuit description data based on the hardware description language. The data processing means can execute the first to third processes explained above.

[3] The program to control a computer to execute the design method for logic circuit may be provided from a readable medium. Namely, the medium records the design support program for logic circuit to execute the first to third processes. Therefore, the design method for logic circuit can be realized easily with an engineering work station and a personal computer.

BRIEF DESCRIPTION OF THE DRAWINGS

FIG. 2 is a diagram for explaining an example the logic circuit description based on the RTL description.

FIGS. 3(A) and 3(B) are diagrams for explaining an adder and a selector as the circuit block examples identified with the logic circuit description.

FIGS. 4(A) to 4(C) are diagrams for explaining the truth value table, Hamming distance and average Hamming distance index of the adder.

FIGS. 7A to 7B are diagrams for explaining examples of the coupling degrees.

FIG. 8 is a diagram for explaining the membership function for determining permission/no-permission of integration.

FIG. 12 is a diagram for explaining the input/output condition of data or the like in the design support system for logic circuit.

FIG. 13 is a diagram for explaining output based on the logic description in the gate level as the result of the optimized logical composition.

DETAILED DESCRIPTION OF THE INVENTION

Figure 1:
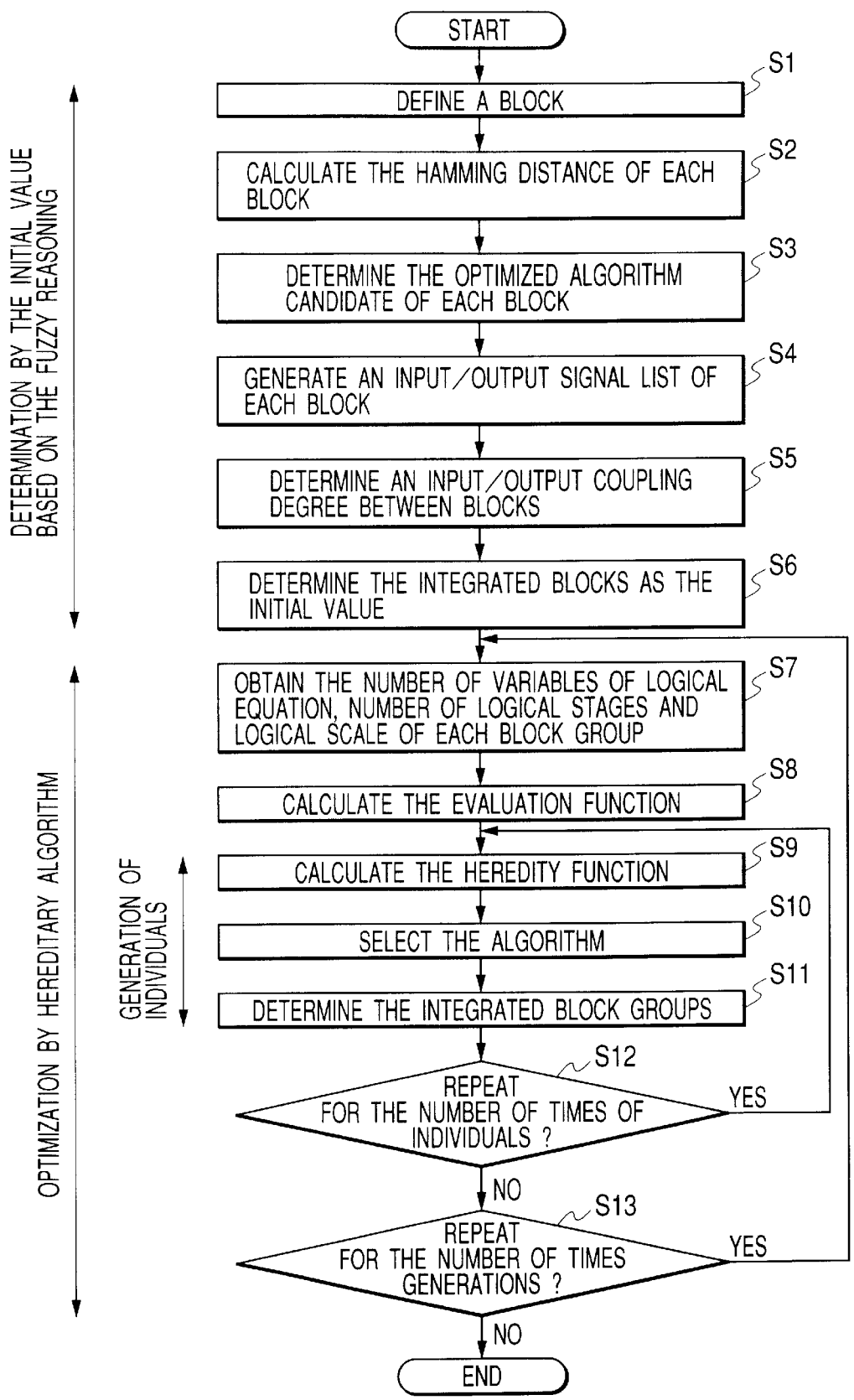
FIG. 1 is a flowchart indicating an example of the design method for logic circuit of the present invention.

FIG. 1 is a flowchart indicating the design method for logic circuit of the present invention.

The design method indicated in FIG. 1 is a method for optimizing the logical composition for the logic circuit description based on the hardware description language such as VHDL and includes an automatic method similar to the optimization based on the discovery which is an experimental method of people combining the fuzzy reasoning and hereditary algorithm. This method can roughly be sorted to the initial value determining process (S1 to S6) based on the fuzzy reasoning for determining the initial values to be integrated based on the fuzzy reason to a plurality of circuit blocks given with the logic circuit description based on the hardware description language, and the optimization process (S7 to S13) based on the hereditary algorithm for optimizing, with the hereditary algorithm, the grouping of a plurality of circuit blocks by reflecting the result of grouping for the circuit blocks to be integrated on the initial condition of the individuals.

The initial value determining process based on the fuzzy reasoning can be sorted to the first process (S1 to S3) for determining the algorithm candidates of circuit blocks given with the logic circuit description based on the hardware description language using the fuzzy reasoning in which the Hamming distance of circuit block is considered, and the second process (S4 to S6) for grouping the common circuit block of the optimization algorithm candidates determined in the first process using the fuzzy reasoning in which the coupling degree among the circuit blocks is considered. The fuzzy reasoning uses the membership function or rule expressing ambiguity and the result of reasoning includes ambiguous result. In more practical, the result of grouping based on the fuzzy reasoning can be adapted to the circuit block which is clearly characterized in the algorithm candidates and coupling degree and the circuit blocks having rather unclear characteristics are not grouped and are temporarily grouped with the other method. Optimization of grouping for the circuit blocks having such unclear characteristics can be realized with the optimization process (S7 to S13) using the hereditary algorithm. In general, the hereditary algorithm is a method for solving the problems with the computer simulation or the like by modeling the natural selection for selecting individuals depending on the heredity mechanism of creatures, namely, crossbreeding of gene, mutation and adaptation degree. Here, such hereditary algorithm has been employed as the third process (S7 to S13) for optimizing the grouping of a plurality of circuit blocks with the hereditary algorithm by reflecting the result of grouping by the second process on the initial condition. The processing flow of FIG. 1 will then be explained in detail.

<<Definition of Block>>

The process of "Definition of Block" S1 of FIG. 1 defines a plurality of circuit blocks given with the logic circuit description based on the hardware description language such as VHDL. For example, the circuit block is defined from the description part such as the always block or function block or the like in the logic circuit description.

FIG. 2 illustrates an example of the logic circuit description based on the RTL description. Here, the assign statement as the function block and the always statement as the always block are indicated. The former defines the adder such as 1-bit full adder illustrated in FIG. 3(A) as the circuit block and the latter defines a selector such as 4-input selector illustrated in FIG. 3(B) as the circuit block.

<<Calculation of Hamming Distance>>

Figures 5A, 5B, 5C, 6:
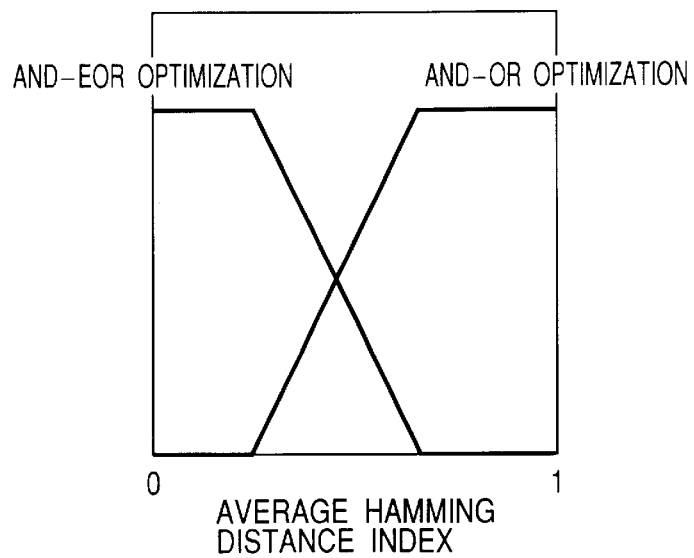
FIGS. 5(A) to 5(C) are diagrams for explaining the truth value table, Hamming distance and average Hamming distance index of the selector.
FIG. 6 is a diagram for explaining the membership function for selecting the algorithm candidates to specify the correlation between the average Hamming distance index and algorithm candidates.

In the process of the "Calculation of Hamming Distance" S2 in FIG. 1, the calculation for Hamming distance is conducted for the circuit block defined in the step S1. The Hamming distance is a parameter indicating a degree of difference of the input/output condition in the circuit block and it can be obtained from the truth value table of the circuit block. In FIG. 4(A), the truth value table of the adder of FIG. 3(A) is indicated and the Hamming distance of it is illustrated in FIG. 4(B). Although the Hamming distance can be detected as the number of different logical values 1/0 between signals in the truth value table but the number of logical values is indicated with the difference from ½ of the number of conditions S in the truth value table in order to accurately discriminate the EOR-based algorithm from the special selector. For example, two kinds of combinations providing different logical values of both signals exist and the number of conditions is 8 between the input Cin and output Z[1] and therefore the Hamming distance becomes 2. The truth value table of the selector of FIG. 3(B) is indicated in FIG. 5(A) and the Hamming distance thereof is illustrated in FIG. 5(B). For example, since four kinds of combinations resulting in different logical values of both signals exist and the number of conditions is 8 between the input S1 and output OUT, the Hamming distance becomes 4. Here, the property of circuit can be detected from the Hamming distance. For example, the logic in which the Hamming distance is matched with the number of signals of circuit block is the function of inverter, the logic near ½ of the number of signal is similar to the function of EOR (exclusive logical sum) and the other logics is near to the function of AND-OR.

The Hamming distance can be adapted to an index for determining the algorithm candidate of the circuit block. Namely, as the membership function used for determining the algorithm candidate of circuit block based on the fuzzy reasoning, a function to specify the correlation between the index considering the Hamming distance obtained from the truth value table of each circuit block and algorithm candidate is used. For example, as the index, the average Hamming distance index is used. This index is expressed as $\Sigma|Hij-S/2|/(N*M*S/2)$ wherein number of conditions of circuit block is S, number of input signals of circuit block is N, number of output signals of circuit block is M and the Hamming distance between the i-th input signal and j-th output signal is Hij. FIG. 4(C) illustrates an example of the average Hamming distance index of the adder illustrated in FIG. 3(A). FIG. 5(C) illustrates an example of the average Hamming distance index of the selector illustrated in FIG. 3(B).

<<Determination of Optimized Algorithm Candidate Group>>

In the process of the "Determination of Optimized Algorithm Candidate Group" S3, the optimized algorithm candidate of the circuit block is determined using the average Hamming distance index.

FIG. 6 illustrates the membership function for selecting the algorithm candidate to specify the correlation between the average Hamming distance index and algorithm candidate. This example is intended to determine the optimization of AND-EOR functions and AND-OR functions depending on whether the circuit block is the circuit of the EOR function or not. The algorithm of the AND-EOR function may be used as the general name of various arithmetic circuits using EOR as represented by an adder. Meanwhile, the algorithm of the AND-OR function may be used as the general name of various data transfer circuits using OR as represented by a selector. In FIG. 6, when the average Hamming distance index of the circuit block considered as the determination object is in the area of optimization of the AND-EOR function (for example, under 0.3), the optimization algorithm candidate of this circuit block is selected as the AND-EOR function. Meanwhile, when the average Hamming distance index of the circuit block considered as the determination object is in the area of the optimization of the AND-OR function (for example, 0.65 or larger), the optimization algorithm candidate of the circuit block is considered as the AND-OR function. When the average Hamming distance index of the circuit block as the determination object is other than the optimization explained above, a part of the circuit blocks is tentatively shared to any algorithm or designated to the other algorithms.

<<Grouping of Circuit Blocks>>

Here, an input/output signal list of each circuit block is generated (S4). Using this list, the coupling degree of the input and output among the circuit blocks is determined (S5). The coupling degree can be detected as the matching ability of the signals among the circuit blocks. For example, the number of common signals (number of signals among the circuit blocks)/total number of input/output signals is defined as the coupling degree, and the coupling degree is determined as high when the value is larger.

FIGS. 7(A) and 7(B) illustrate examples of the coupling degree. In FIG. 7(A), the circuit blocks BLK1, BLK2, BLK3 are examples of a plurality of common circuit blocks of the optimization algorithm determined in the optimization algorithm candidate determining process (S3). IN[0:7] is the input data of 8 bits, OUT1[0:7], OUT2[0:7], OUT[0:7] are output data of 8 bits and CTL1, CTL2, SEL are control signals of 1 bit, respectively. Various combinations of circuit blocks and coupling degree in FIG. 7(A) are illustrated in FIG. 7(B).

For various combinations of a plurality of common circuit blocks of the optimization algorithm candidate, whether the relevant circuit groups are integrated for the grouping or not is determined using the membership function illustrated in FIG. 8. When permission/no-permission of integration is determined using the membership function of FIG. 8, for example, for the coupling degree of FIG. 7(B), the circuit blocks BLK1 and BLK3 or block BLK1 and BLK2 are grouped as the circuit blocks to be integrated.

As explained above, the optimization algorithm candidate is assigned to the circuit block using the average Hamming distance index and the circuit blocks having the same algorithm as the optimization candidate of the higher coupling degree are grouped as those to be integrated. This result is defined as the initial value of the blocks to be integrated (S6) and it is reflected on determination of the initial condition of individuals with the next hereditary algorithm.

<<Optimization with Hereditary Algorithm>>

In the hereditary algorithm, an individual is generated as a candidate of solution, adaptation degree is evaluated using an evaluation function to the individual, the highly evaluated individual is selected, operations such as crossbreeding and mutation are executed to the selected individual to generate the aggregation of individuals of the next generation, such operations are repeated for subsequent generations to increase the individuals having higher adaptation degree and simultaneously the probability for appearance of individuals near the optimized solution and the individual of which evaluation value has reached a constant value is defined as the optimized solution to be obtained.

In FIG. 1, the grouping of a plurality of circuit blocks is optimized with the hereditary algorithm by reflecting the result of grouping as the circuit blocks to be integrated on the initial condition of individual. For example, each individual has many gene data each of which is formed of a pair of the circuit blocks grouped for integration and corresponding algorithm candidate. It is desirable that the number of individuals is multiple number and it is enough when many individuals are generated at the beginning assuming the condition for grouping in various manners for the circuit blocks to which the optimization algorithm is not assigned. In any individual, genes for the result of grouping of the circuit blocks to be integrated based on the fuzzy reasoning are included. For the determination of adaptation degree to these individuals, V*S*L is used as the evaluation function, considering, for example, the number of variables V of logical equation expressed with the circuit blocks to be integrated, number of stages of logic S and the combined load L which increases as the scale of logic becomes large. In the step S8, the evaluation function is calculated for each circuit block to be integrated.

Figure 9A:
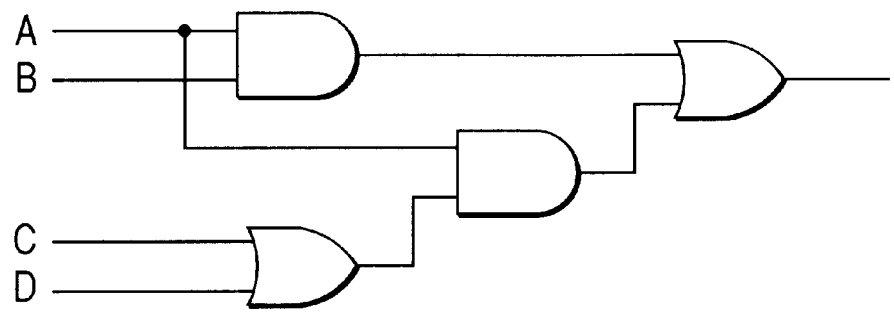
FIGS. 9(A) to 9(B) are diagrams for explaining the logical equation of circuit block groups to be integrated and tendency of combined load for the scale of logic.
Figure 9B:
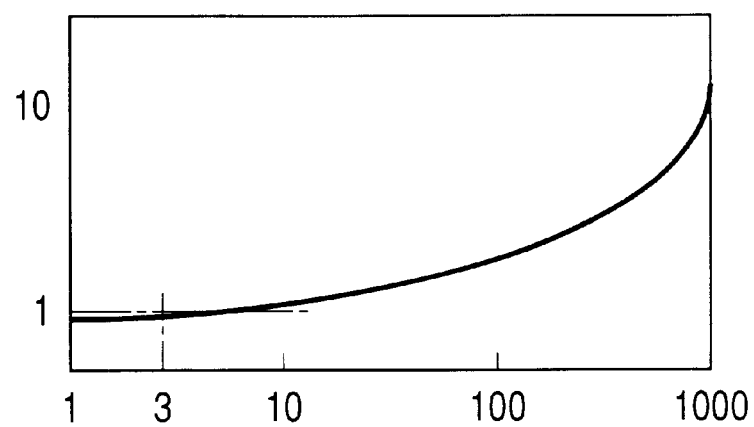

FIGS. 9(A) and 9(B) illustrate logical equation of circuit block group to be integrated and combined load for the logical scale. In FIG. 9(A), the symbol & means the logical product and the symbol | means logical sum. According to the logical equation in FIG. 9(A) and combined load for the logical scale of FIG. 9(B), a value of the evaluation function of such circuit block group is 4 (number of variables)*3 (number of logical stages)*1.1(combined load)=13.2.

In step S9 of FIG. 1, whether an individual is highly evaluated or not is determined based on the evaluation function. The algorithm of operations of crossbreeding and mutation or the like is selected for the individual selected as the highly evaluated individual (S10) and it is determined (S11) to which individual of the next generation which gene is transferred depending on the selected algorithm or which circuit block should be integrated. The processes of the steps S9 to S11 are executed to all individuals of the same generation (S12) and thereafter one generation is increased (S13) to repeat the processes of the step S7 to S13. In this example, the optimized solution is included in the individual left when the number of generations of process has reached a constant value. For example, the optimized solution is the individual which is evaluated in the highest degree in the step S9 of the final generation.

Figure 10:
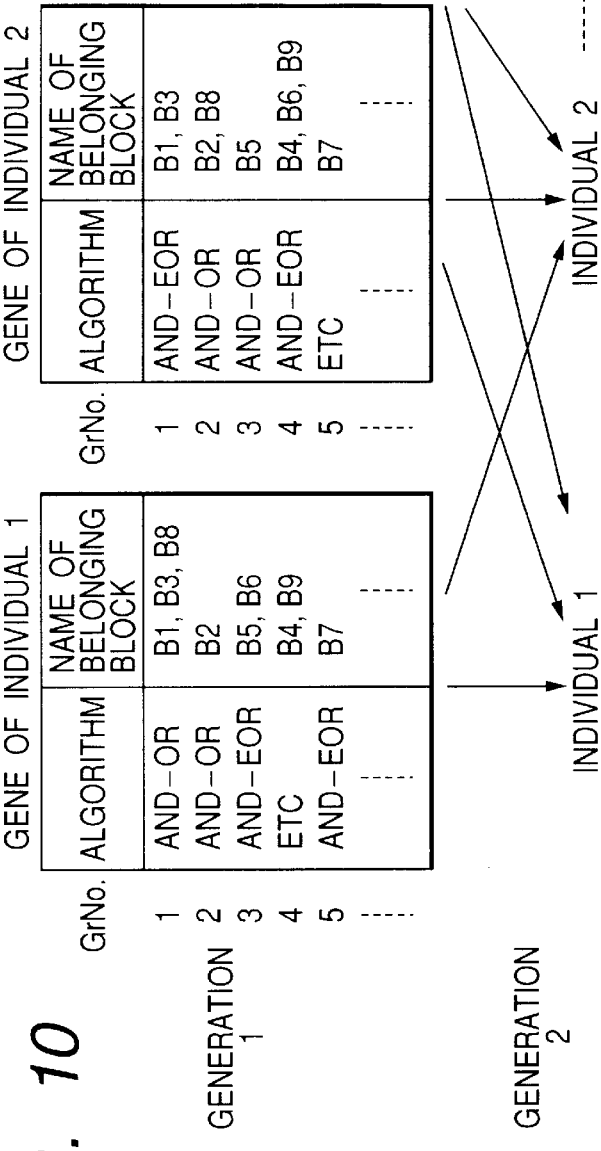
FIG. 10 is a schematic diagram for explaining a profile of transfer of the heredity information.

FIG. 10 schematically illustrates a profile of transfer of the heredity information. For the transfer of heredity information, the integrated circuit group to which the optimization algorithm is assigned based on the fuzzy reasoning is not divided as a rule even after several generations but the division is conducted only when the logical scale has exceeded the maximum scale due to the relationship with the other groups as a result of integrations for several generations. Integration/division of circuit blocks among individuals is conducted at random but heredity set-up is executed for the common part of gene of a plurality of highly evaluated individuals. Mutation is generated at random in the range, for example, not exceeding 10%.

The result derived through the optimization process based on the hereditary algorithm is division which results in overheads as least as possible within the logical scale which may be combined and simultaneously the optimization algorithm candidate for such circuit block is also determined. Therefore, it is possible to immediately obtain the logical composition result depending on the result. Moreover, since manual trial and error method is not executed, it is now possible to reduce the period required for logical composition for logic circuit description based on the hardware description language and to reduce usual fluctuation of the logical composition result for the logic circuit description based on the hardware description language. Accordingly, much contribution may be made for improvement of performance of the semiconductor integrated circuit designed through the logical composition for the logic circuit description based on the hardware description language.

Figure 11:
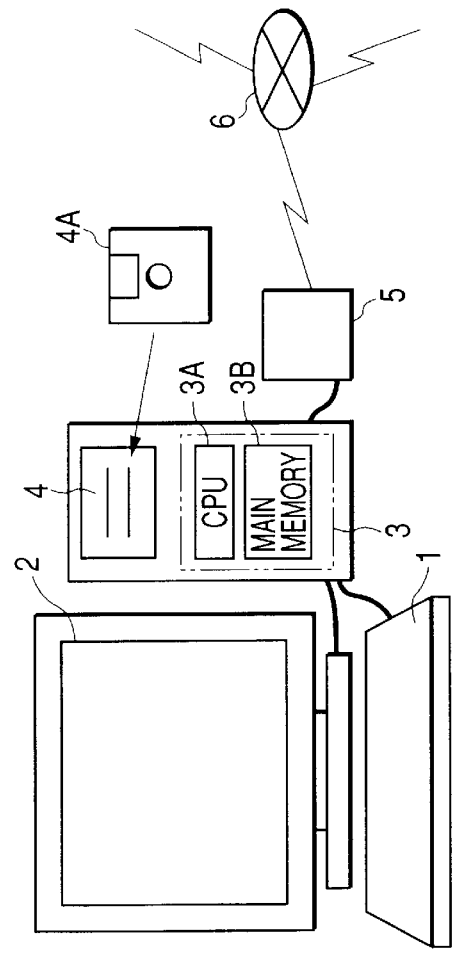
FIG. 11 is a block diagram of the design support system for logic circuit of the present invention.

FIG. 11 illustrates the design support system for logic circuit to realize design method for logic circuit. The system illustrated in this figure may be realized with an engineering work station or a personal computer system, comprising: a keyboard 1 as an input means; a display 2 as the display means; a computer unit 3 as the data processing means including CPU board mounting CPU3A and main memory 3B and interface board; an auxiliary memory 4; and a communication interface circuit 5 such as terminal adapter and a modem or the like. The communication interface circuit 5 is also an example of the input means. Although not restricted particularly, the auxiliary memory 4 is formed of a hard disc drive providing a stationary magnetic disc, a memory card device which can load/unload a flash memory card, a floppy disc drive which can read and write data to/from a floppy disc, CD-ROM drive which can read CD-ROM, and an MO drive which can read/write data from/to an MO disc. Reference symbol 4A is generally called a medium of the auxiliary memory 4. The auxiliary memory 4 is an example of the input means. The communication interface circuit 5 may be connected to the public telephone network 6 or the like. CPU3A loads, although not restricted particularly, the program read from the medium 4A or the program down-loaded via the communication interface means 5 to the main memory 3B or the like for execution. The data required for execution of program is read from the medium 4 in the same manner, down-loaded using the communication interface 5 and can be inputted from the keyboard 1.

In the design support system for logic circuit, the auxiliary memory 4 or communication interface circuit 5 as the input means is capable of inputting the logic circuit description data based on the hardware description language. The computer unit 3 executes the optimization process of the logical composition illustrated in FIG. 1 using the input logic circuit description data.

The operation program for the computer unit to execute the optimization process of the logical composition is provided with a readable medium 4A. This program is formed of the object code required for the computer unit 3 to execute the process explained in FIG. 1. It is now easy to realize optimization of logical composition for logical design of a semiconductor integrated circuit with a computer by providing the necessary program via the medium 4A.

FIG. 12 illustrates the input/output conditions of data or the like in the design support system for logic circuit. The hardware description and control information are inputted and moreover the operation program is set to the design support system for logic circuit 10, and the operation program is executed to output the logical composition script or composition result. FIG. 13 illustrates a logical composition output example with the logical description in the gate level. The practical description of the same figure is not correlated with a practical example of the logic circuit.

The present invention has been explained in practical based on the embodiments thereof but the present invention is not limited thereto and allows of course variable changes and modifications within the scope not departing from the contents of claims.

For example, in above example, the coupling degree is identical to the number of common signals (number of signals among circuit blocks)/number of total input/output signals and the coupling degree is determined high when above value is larger. However, it is also consider to provide a variation in which the coupling degree is thought high when the value of the number of output signals after coupling/number of input/output signals of each Σblock is small.

The membership function and evaluation function can further be tuned by adding the other items. Moreover, the application mode of Hamming distance and manner for evaluating coupling degree or the like may be changed as required. Moreover, the grouping based on the fuzzy reasoning may be implemented, depending on the result of fuzzy reasoning, not only to the circuit block to which the optimization algorithm candidate is assigned but also to the circuit block of rather ambiguous result determination for the algorithm candidate. Although it may be a matter of source, it is clearly possible that the tentative grouping may be executed, with the method other than the fuzzy reasoning result or depending on the instruction from an operator, to the circuit blocks having rather ambiguous determination result of the algorithm based on the fuzzy reasoning.

The typical inventions among the inventions disclosed in the present specification will be briefly explained as follows.

Namely, the result derived through the optimization process based on the hereditary algorithm is the division providing overhead as small as possible within the logical scale to be integrated and since the algorithm for the block is also determined simultaneously, the logical composition result can immediately be obtained depending on such result. Moreover, the period required for logical composition for the logic circuit description based on the hardware description language can be reduced and moreover usual fluctuation of the logical composition result for the logic circuit description based on the hardware description language can also be reduced. Now, it is possible that much contribution may be made for improvement of performance of the semiconductor integrated circuit designed via the logical composition for the logic circuit description based on the hardware description language. Moreover, the number of times of trial-and-error due to the automatic process for the system as a whole can be reduced remarkably by apparently applying the factors which are rather intrinsically ambiguous such as characteristic evaluation of logic by the Hamming distance and evaluation function used for the hereditary algorithm or the like.

What is claimed is:

1. A design method for a logic circuit, comprising:

a first process for determining, with fuzzy reasoning, an optimization algorithm candidate of each of circuit blocks, wherein each of the circuit blocks is provided by a logic circuit description based on a hardware description language;

a second process for grouping, with fuzzy reasoning, circuit blocks regarded as circuit blocks to be integrated from circuit blocks each of which is determined as a predetermined optimization algorithm candidate in said first process; and a third process for optimizing, with a hereditary algorithm, grouping of circuit blocks in a plurality of circuit blocks by reflecting the result of grouping by said second process on an initial condition.

2. A design method for a logic circuit, comprising:

a first process for determining, with fuzzy reasoning considering Hamming distance of a circuit block, an optimization algorithm candidate of each of circuit blocks, wherein each of the circuit blocks is provided by a logic circuit description based on a hardware description language;

a second process for grouping, with fuzzy reasoning considering a coupling degree among circuit blocks, circuit blocks regarded as circuit blocks to be integrated from circuit blocks each of which is determined as a predetermined optimization algorithm candidate in said first process; and a third process for optimizing, with a hereditary algorithm, the grouping of circuit blocks to be integrated by reflecting the result of grouping in said second process on an initial condition of the hereditary algorithm.

3. A design method for a logic circuit according to claim 2, wherein said first process determines an optimization algorithm candidate based on a correlation between an index considering the Hamming distance indicating a degree of difference of input/output conditions of the circuit blocks and an algorithm candidate.

4. A design method for a logic circuit according to claim 3, wherein said index is average Hamming distance index given as $\Sigma|Hij-S/2|/(N*M*S/2)$ wherein number of conditions of the circuit block is S, number of input signals of the circuit block is N, number of output signals of the circuit block is M and the Hamming distance between the i-th input signal and j-th output signal is Hij.

5. A design method for a logic circuit according to claim 4, wherein correlation between said index and an algorithm candidate is given with a membership function which specifies, in relation to said index, the certainty to which a candidate of AND-EOR function, AND-OR function and other candidates an algorithm candidate is most similar.

6. A design method for a logic circuit according to claim 2, wherein said second process groups the circuit blocks to be integrated based on correlation between a coupling degree considering matching ability of signals among the circuit blocks and permission/no-permission of integration for the circuit blocks.

7. A design method for a logic circuit according to claim 2, wherein the third process uses an evaluation function considering logical scale depending on the grouping of the circuit blocks.

8. A design method for a logic circuit according to claim 7, wherein the third process uses an evaluation function considering number of variables of logic by the grouping of the circuit blocks, number of logical stages and combined load.

9. A design support system for a logic circuit, comprising:
    a memory;
    input means; and
    data processing means for conducting a process using said memory and input information from said input means, wherein
        said input means is adapted to input logic circuit description data based on a hardware description language, and
        said process to be conducted by the data processing means includes:
            a first process for determining, with fuzzy reasoning, an optimization algorithm candidate of each of circuit blocks, wherein each of the circuit blocks is provided by said logic circuit description data;
            a second process for grouping, with fuzzy reasoning, circuit blocks regarded as circuit blocks to be integrated from circuit blocks each of which is determined as a predetermined optimization algorithm candidate in said first process; and
            a third process for optimizing, with a hereditary algorithm, grouping of circuit blocks in a plurality of circuit blocks by reflecting the result of grouping by said second process on an initial condition.

10. A design support system for a logic circuit, comprising:
    a memory;
    input means; and
    data processing means for conducting a process by utilizing said memory and input information from said input means, wherein
        said input means is adapted to input logic circuit description data based on a hardware description language, and
        said process to be conducted by the data processing means includes:
            a first process for determining, with fuzzy reasoning considering Hamming distance of a circuit block, an optimization algorithm candidate of each of circuit blocks, wherein each of the circuit blocks is provided by said logic circuit description data;
            a second process for grouping, with fuzzy reasoning considering a coupling degree among the circuit blocks, circuit blocks regarded as circuit blocks to be integrated from circuit blocks each of which is determined as a predetermined optimization algorithm candidate in said first process; and
            a third process for optimizing, with a hereditary algorithm, the grouping of circuit blocks to be integrated by reflecting the result of grouping in said second process on an initial condition of the hereditary algorithm.

11. A design support system for a logic circuit according to claim 10, wherein said data processing means determines, in said first process, an optimization algorithm candidate based on correlation of an index considering the Hamming distance indicating a degree of difference of input/output conditions of the circuit blocks and an algorithm candidate.

12. A design support system for a logic circuit according to claim 11, wherein said index is the average Hamming distance index expressed as $\Sigma|Hij-S/2|/(N*M*S/2)$ wherein number of conditions of the circuit block is S, number of input signals of the circuit block is N, number of output signals of the circuit block is M and the Hamming distance between the i-th input signal and j-th output signal is Hij.

13. A design support system for a logic circuit according to claim 12, wherein correlation between said index and an algorithm candidate is given with a membership function which specifies, in relation to said index, the certainty to which a candidate of AND-EOR function, AND-OR function and other candidates an algorithm candidate is most similar.

14. A design support system for a logic circuit according to claim 10, wherein said data processing means groups, in said second process, the circuit blocks to be integrated based on correlation between a coupling degree considering matching ability of signals among the circuit blocks and permission/no-permission of integration for the circuit blocks.

15. A design support system for a logic circuit according to claim 10, wherein said data processing means uses, in said third process, an evaluation function considering logical scale based on the grouping of the circuit blocks.

16. A design support system for a logic circuit according to claim 15, wherein said data processing means uses, in the third process, the evaluation function considering number of variables of logic, number of logic stages and combining load by the grouping of the circuit blocks.

17. A readable medium recording a design support program for a logic circuit, wherein a process executed by the design support program comprises:
    a first process for determining, with fuzzy reasoning, an optimization algorithm candidate of each of circuit blocks, wherein each of the circuit blocks is provided by a logic circuit description based on a hardware description language;
    a second process for grouping, with fuzzy reasoning, circuit blocks regarded as circuit blocks to be integrated from circuit blocks each of which is determined as a predetermined optimization algorithm candidate in said first process; and
    a third process for optimizing, with a hereditary algorithm, grouping of circuit blocks in a plurality of circuit blocks by reflecting the result of grouping by said second process on an initial condition.

18. A readable medium recording design support program for a logic circuit, wherein a process executed by the design support program comprises:
    a first process for determining, with fuzzy reasoning considering Hamming distance of a circuit block, an optimization algorithm candidate of each of circuit blocks, wherein each of the circuit blocks is provided by a logic circuit description based on a hardware description language;
    a second process for grouping, with fuzzy reasoning considering a coupling degree among the circuit blocks, circuit blocks regarded as circuit blocks to be integrated from circuit blocks each of which is determined as a predetermined optimization algorithm candidate in said first process; and a third process for optimizing, with a hereditary algorithm, the grouping of circuit blocks to be integrated by reflecting the result of grouping by said second process on an initial condition of the hereditary algorithm.

19. A readable medium according to claim 18, wherein said first process determines an optimization algorithm candidate based on correlation between an index considering the Hamming distance indicating a degree of difference of input/output conditions of circuit blocks and an algorithm candidate.

20. A readable medium according to claim 19, wherein said index is the average Hamming distance index given as $\Sigma|H_{ij}-S/2|/(N*M*S/2)$ wherein number of conditions of circuit block is S, number of input signals of circuit block is N, number of output signals of circuit block is M and the Hamming distance between the i-th input signal and j-th output signal is $H_{ij}$.

21. A readable medium according to claim 20, wherein correlation between said index and an algorithm candidate is given with a membership function which specifies, in relation to said index, the certainty to which a candidate of AND-EOR function, AND-OR function and other candidates an algorithm candidate is most similar.

22. A readable medium according to claim 18, wherein said second process groups the circuit blocks to be integrated based on correlation between a coupling degree considering matching ability of signals among the circuit blocks and permission/no-permission of integration for the circuit blocks.

23. A readable medium according to claim 18, wherein said third process uses an evaluation function considering logical scale based on the grouping of the circuit blocks.

24. A readable medium according to claim 23, wherein said third process uses the evaluation function considering number of modifications of logic, number of logical stages and combining load based on the grouping of the circuit blocks.

* * * * *